United States Patent [19]
Johansen

[11] Patent Number: 5,697,501
[45] Date of Patent: Dec. 16, 1997

[54] ELECTROSTATIC DISCHARGE PROTECTION DEVICE

[75] Inventor: Arnold W. Johansen, Marlboro, Mass.

[73] Assignee: Polaroid Corporation, Cambridge, Mass.

[21] Appl. No.: 577,920

[22] Filed: Dec. 21, 1995

[51] Int. Cl.$^6$ ............................................. H01R 13/703
[52] U.S. Cl. .................... 206/719; 206/726; 439/188; 439/510
[58] Field of Search .................... 206/701, 719, 206/722, 726, 727, 728; 439/188, 189, 181, 507, 509, 510, 513, 514, 515

[56] References Cited

U.S. PATENT DOCUMENTS

| | | | |
|---|---|---|---|
| 3,467,940 | 9/1969 | Wallo | 339/14 |
| 3,653,498 | 4/1972 | Kisor | 206/46 H |
| 3,774,075 | 11/1973 | Medesha | 317/2 R |
| 4,019,094 | 4/1977 | Dinger et al. | 361/220 |
| 4,617,605 | 10/1986 | Obrecht et al. | 361/220 |
| 4,971,568 | 11/1990 | Cronin | 439/188 |
| 5,108,299 | 4/1992 | Cronin | 439/188 |
| 5,163,850 | 11/1992 | Cronin | 439/507 |
| 5,164,880 | 11/1992 | Cronin | 361/220 |
| 5,259,777 | 11/1993 | Schuder et al. | 439/188 |
| 5,289,336 | 2/1994 | Gagliano | 361/220 |
| 5,401,180 | 3/1995 | Muislay | 439/188 |
| 5,538,434 | 7/1996 | Delguidice et al. | 439/188 |

FOREIGN PATENT DOCUMENTS

| | | |
|---|---|---|
| 2348630 | 3/1975 | Germany . |
| 0071031 | 9/1983 | Germany . |
| 59-13353 | 1/1984 | Japan . |
| 61-148852 | 11/1986 | Japan . |
| 62-276855 | 1/1987 | Japan . |

OTHER PUBLICATIONS

Middlebrook, Carlton G., "Electrical Shorting Cap," Navy Technical Disclosure Bulletin, vol. 6, No. 3, Mar. 1981, pp. 33–36 (Navy Technology Catalog No. 5260 1530, Navy Case No. 63818).

Wang, Shay-Ping T., and Ogden, Paul, "Membrane–Type Pin Protector for Pin Grid Array Devices," 1991 IEEE/SEMI Advanced Semiconductor Manufacturing Conference, pp. 120–127.

Primary Examiner—Jacob K. Ackun
Attorney, Agent, or Firm—Christopher P. Ricci

[57] ABSTRACT

An electrostatic discharge protection device is disclosed for use with a semiconductor chip package where the electrostatic discharge protection device establishes an electrical connection between connector pins on the semiconductor chip package and ground thereby creating a short circuit to protect the semiconductor chip package from electrostatic discharge. The electrostatic discharge protection device is manually operable to engage or disengage and also automatically withdraws the shorting connection upon insertion of the semiconductor chip package onto a printed circuit board or into a mating receptacle.

21 Claims, 5 Drawing Sheets

ELECTROSTATIC DISCHARGE PROTECTION DEVICE

BACKGROUND OF THE INVENTION

The present invention relates generally to electrostatic discharge protection devices. More particularly, the invention relates to electrostatic discharge protection devices for semiconductor chip packages ("SCP") where the electrostatic discharge protection device connects selected pins on the SCP so they are grounded or maintained at the same electrical potential to inhibit electrostatic charge accumulation when the SCP is not mounted on a circuit board or other receptor, and disconnects the ground connection upon operative combination of the SCP on the circuit board or other receptor or, optionally, disconnects the ground connection manually by a user.

Electrostatic charge is a stationary electric charge which accumulates on various surfaces. An electrostatic discharge occurs when the electrostatic charge becomes substantial enough to overcome a dielectric material between the charge and another surface of lower electrical potential. An example of such a discharge as naturally occurring is lightning.

Electrostatic discharge in the realm of electronics can be devastating to microelectronic devices. A sharp voltage spike caused by an electrostatic discharge can cause permanent and costly damage to individual precision devices, such as random access memory or other semiconductor devices, inter alia.

Many commercially available electrostatic discharge protection devices in use today consist primarily of electrostatic discharge packaging of the SCP in electrically conductive strips, pellets, boxes, and plastic tubing which provide effective electrostatic discharge protection until the user is about to insert the SCP into complementary receptacles on the circuit board or other receptor. At that point the user must remove the electrostatic discharge packaging from the SCP thus rendering the SCP vulnerable to electrostatic discharge in order to position and insert the connector pins into the receptacle. Accordingly, as the user inserts the connector pins of the SCP into the receptacles, the semiconductor dies housed within the SCPs could be destroyed by electrostatic discharge and the SCP would therefore have to be replaced.

Consequently a need still exists within the semiconductor chip packaging industry for a true electrostatic discharge protection device, rather than electrostatic discharge protection packaging which effectively protects the semiconductor die from electrostatic discharge until the connector pins of the SCP are inserted into the receptacles of the connector and then protects the semiconductor die from electrostatic discharge again when the connector pins are removed from the receptacles.

Prior art electrostatic discharge protection device generally consist of small metallic pieces that must be inserted over the pins of the semiconductor chip package. This method of attachment is not amenable to tool insertion due to their size and flexibility and can also be difficult to do by hand.

Moreover, certain types of semiconductor chip packages, such as laser packages, must be tested before being soldered onto a circuit board or otherwise made up to a receptor. Since prior art electrostatic discharge protection devices require insertion into receptacles before withdrawal or manual removal, testing becomes more difficult.

Additionally, a final step in the manufacturing of circuit boards is a step of washing components on the board. When components are soldered down flush to the circuit board particles that would normally be washed out become trapped under the components if, on the other hand, the components are soldered such that space remains between the circuit board and the components then there is not sufficient downward force available to withdraw a ground shunt in a prior art electrostatic discharge protection device.

Other commonly assigned patents and copending applications include U.S. Pat. No. 4,971,568 entitled "Electrical Connector With Attachment For Automatically Shorting Select Conductors Upon Disconnection of Connector" by David V. Cronin issued Nov. 20, 1990, U.S. Pat. No. 5,163,850 entitled Electrostatic Discharge Protection Devices For Semiconductor Chip Packages" by David V. Cronin issued Nov. 17, 1992, U.S. Pat. No. 5,164,880 entitled "Electrostatic Discharge Protection Device for a Printed Circuit Board" by David V. Cronin issued Nov. 17, 1992, and pending U.S. application Ser. No. 234,917 entitled "Electrostatic Discharge Protection Device" by David V. Cronin filed Apr. 28, 1994.

Accordingly, it is an object of this invention to provide electrostatic discharge protection devices which operate to automatically open a short between selected conductors upon connection with a mating receptacle or are adapted to manually open the short circuit during testing.

It is another object of this invention to provide space between the electrostatic discharge protection device and the circuit board to allow washing under the electrostatic discharge protection device.

It is still another object of the invention to provide an electrostatic discharge protection device which is easier to insert onto a semiconductor chip package.

These and other objects of the invention will be obvious and will appear hereinafter.

SUMMARY

The aforementioned and other objects are achieved by the invention which provides, an electrostatic discharge protection device. The electrostatic discharge protection device is useful with semiconductor chip packages of a type that has top and bottom surfaces, a plurality of lateral surfaces integral therewith. The semiconductor chip package that will be used in the illustrations and described herein is a type that has connector pins disposed in a spaced apart relationship with respect to each other extending from the bottom surface. It should be noted that this arrangement is purely illustrative and should not be deemed restrictive. At least one of the connector pins extending from the bottom surface of the semiconductor chip package is a ground pin.

The electrostatic discharge protection device operates to automatically short the connector pins with the ground pin and to automatically disconnect the connector pins from the ground pin when the semiconductor chip package is inserted into a circuit board or otherwise into a receptor. The electrostatic discharge protection device comprises a base section, a grounding means, and an actuation means.

The base section is substantially planar and is disposed on the bottom surface of the semiconductor chip package. The base section has a plurality of holes adapted to receive the plurality of connector pins such that they pass therethrough. Further, the base section has vertical extensions protruding vertically away from the bottom surface of the semiconductor chip package. It has nubs disposed normal to the vertical extensions at a distal end.

The grounding means then overlies the base section and has a tab that extends around the bottom of the base section so as to be between the base section and the semiconductor chip package. The grounding means has fastening pin holes that allow the grounding pin to pass therethrough with an interference fit such that the pinholes dig into the ground pin to secure the base section and the grounding means securely to the semiconductor chip package. The grounding means is therefore in electrical communication with the ground pin. The ground loop extends therefrom, which is biased into electrical contact with the connector pins of the semiconductor chip package, thereby, establishing a shunt between the ground pin and the connector pins. The grounding means has an operative position for connecting the shunt, and has an inoperative position where the bias of the ground loop is overcome thereby pushing the ground loop away from the connector pins and disconnecting the shunt thus providing electrical isolation between the plurality of connector pins and the ground pins.

Once electrostatic discharge protection is no longer needed, for example, during testing, or upon insertion into a circuit board or mating receptacle. The electrostatic discharge protection device is placed into the inoperative position. In the inoperative position the grounding loop is disconnected from the connector pins by the force of an actuation disk which is pushed by mechanical contact with the receptor down over the grounding means which in turn pushes the grounding loop away from the connector pins and into the inoperative position.

In further aspects, the invention provides methods in accord with the apparatus described above. The aforementioned and other aspects of the invention are evident in the drawings and in the description that follows.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION

While the present invention retains utility with a wide variety of semiconductor devices and may be embodied in several different forms, it is advantageously employed in connection with a metal semiconductor laser package. Though this is the form of the preferred embodiment and will be described as such, this embodiment should be considered illustrative and not restrictive.

Figure 1A:
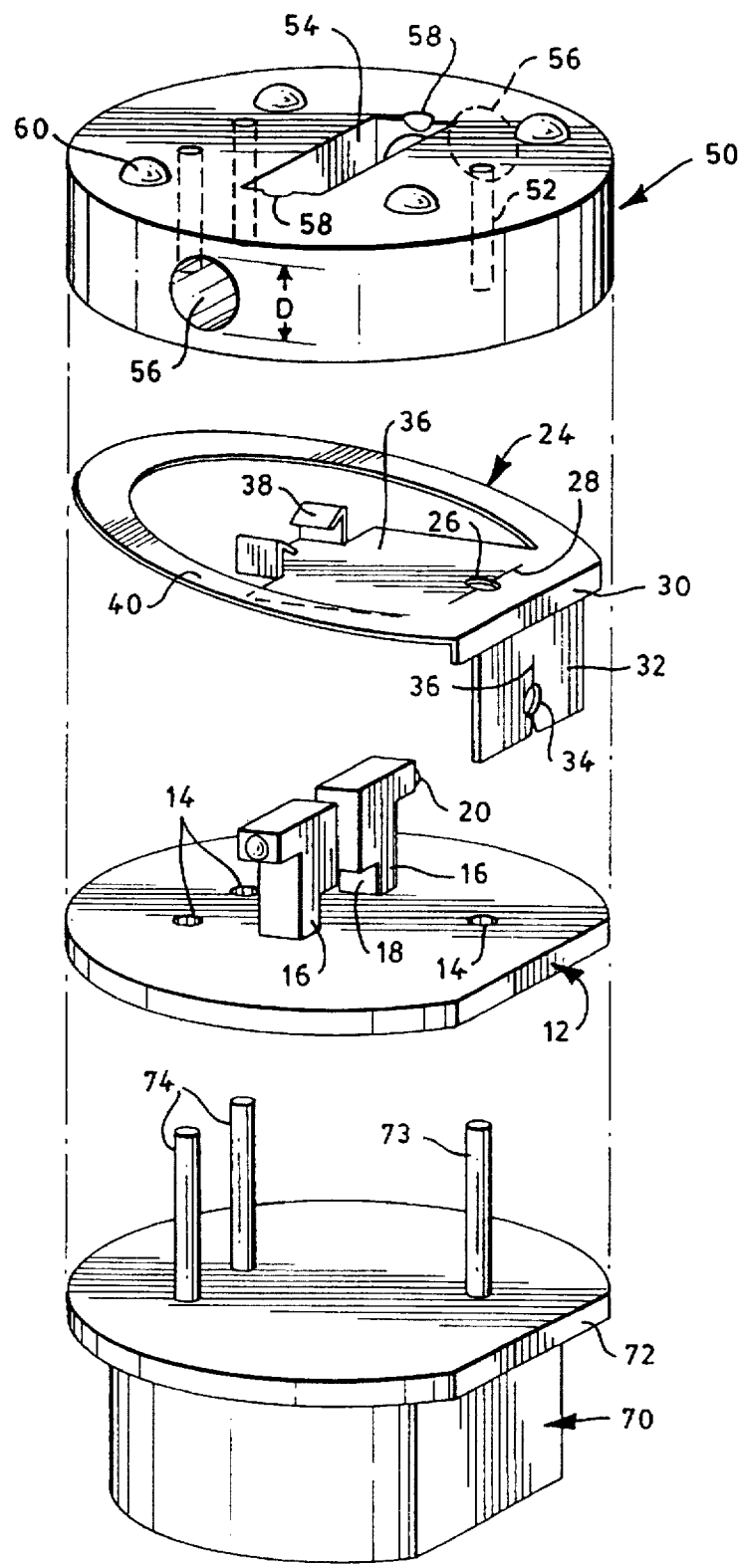
FIG. 1A shows an exploded perspective view of an electrostatic discharge protection device of this invention.

FIG. 1 shows an electrostatic discharge protection device 10 generally which comprises three sections. A base disk 12, ground plate 24, and an actuation disk 50. The base disk 12 is substantially planar, having pinholes passing therethrough to accommodate connector pins on a semiconductor chip package. The pin holes 14 are wide enough to easily allow the connector pins to pass therethrough. Base disk 12 is fabricated of a substantially non-conducting material such as a non-conductive plastic. By using such a material it is ensured that conducting between the pins through inadvertent contact with the pinholes 14 is inhibited. Vertical extensions 16 extend substantially perpendicularly away from the plane of the base disk 12. These vertical extensions are ultimately used to guide the electrostatic discharge protection device between operative and inoperative conditions, as will be further described hereinafter.

Protruding from the vertical extensions are nubs 20 which are integral with the locking mechanism of the electrostatic discharge protection device.

The ground plate is fabricated of a conductive material and makes the connection between the conductor pins of the semiconductor chip package and the ground pin on the semiconductor chip package. Ground plate 24 does so by being secured to the ground pin through a first fastening pinhole 26 having horizontal slots 28. The first fastening pinhole 26 is sized to have an interference fit with the ground pin such that pushing the ground plate 24 over the conductor pin causes the horizontal slot 28 to open and the ground plate 24 to bulge as it is pushed down over the ground pin. The edges of the horizontal slot 28 then dig into the conductor pin, thereby causing the ground plate to be securely attached over the semiconductor chip package, but also securing the base disk 12 in between.

To further secure the ground plate 24, a vertical bend 30 is made having a height substantially equivalent to that of the base disk 12 and having a tab 32 extending therefrom. The tab 32 is bent to pass in between the base disk 12 and the semiconductor chip package so as to provide an additional point of locking onto the semiconductor chip package. This is provided by a second fastening pinhole 34 having vertical slots 36, which act in the same way as the first fastening pin hole 26. The ground pin on the semiconductor chip package is inserted through the second fastening pin hole 34, where the vertical slots 36 bite into the ground pin to secure it in position. The ground pin then passes through one of the pin holes 14 in the base disk 12, and subsequently passes through the first fastening pinhole 26, thereby insuring that the ground plate 24 and the base disk 12 are secured onto the semiconductor chip package and at the same time providing a redundant electrical connection to the ground pin.

Further, securing extensions 38 in the ground plate 24 which are outwardly biased are pushed against the vertical extensions 16 down to fastening cuts 18 in the vertical extension 16. Once the securing extensions 38 snap into the fastening cuts 18, the ground plate 24 is further locked into position.

The semiconductor chip package 70 generally described comprises a top surface, bottom surface, and between the top and bottom surface a plurality of lateral surfaces. A plurality of connector pins 74 are disposed on the base section 72 in a substantially parallel and spaced apart relationship with respect to each other. Though the semiconductor chip package pictured herein is a laser diode having a can type configuration with a base section 72 attached thereto, one skilled in the art will recognize that the invention may also be used with other types of semiconductor packages including, but not limited to, dual in-line packages.

The plurality of connector pins 74 are adapted for physical and electrical connection to a receptor typically on a printed circuit board having a substantially planar surface on one selected side thereof or where the receptor is integral with the printed circuit board.

The ground loop 40 is yieldably biased by means well known in the art such to have a built-in resilient spring bias. The resilient spring bias urges the ground loop 40 against a plurality of connector pins 74, thereby creating an electrical interconnection between the plurality of connector pins and the ground pin 73.

In one embodiment of the ground loop 40, there is a split 39 separating the ground loop 40 into two sections. The split 39 allows each of the two resulting sections to act independently. Independence of movement allows the ground loop 40 to conform to each of the connector pins 74 thus ensuring electrical contact with each of the connector pins 74.

Figure 1B:
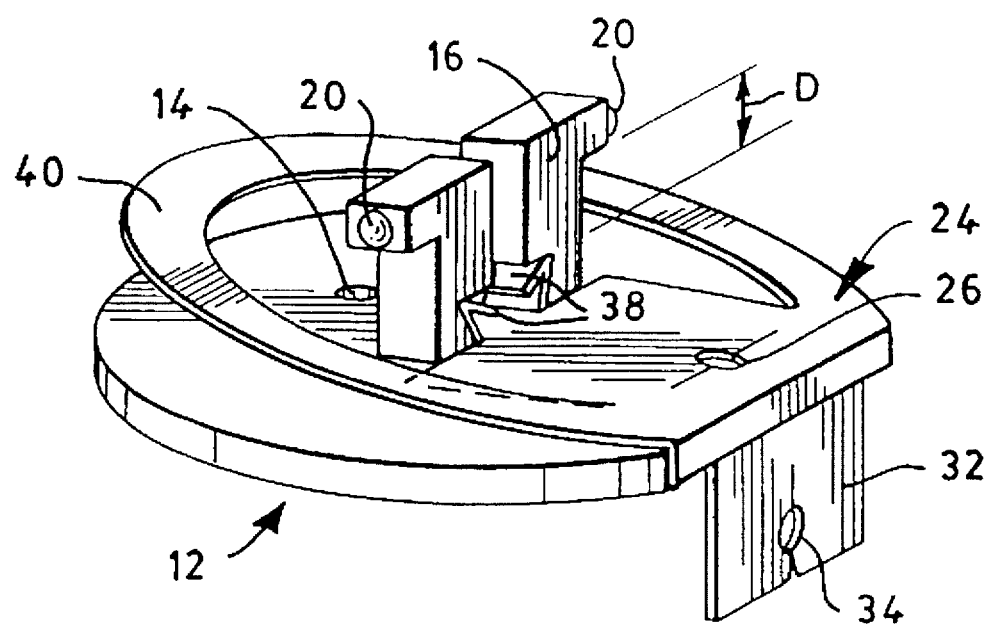
FIG. 1B shows a perspective view of a base section and a grounding plate of the device shown in FIG. 1 mated together.
Figure 2:
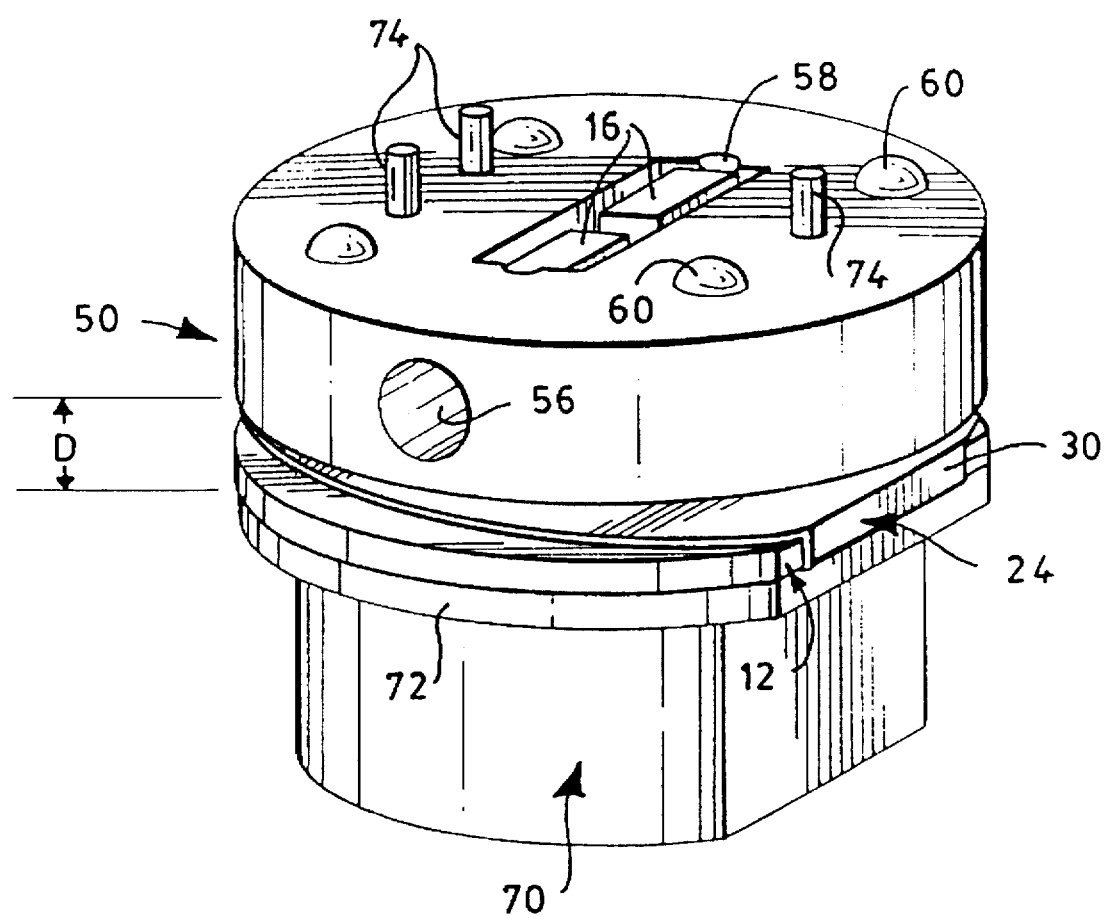
FIG. 2 shows a perspective view of an electrostatic discharge protection device as shown in FIG. 1 mated to a bottom surface of a semiconductor chip package.
Figure 3:
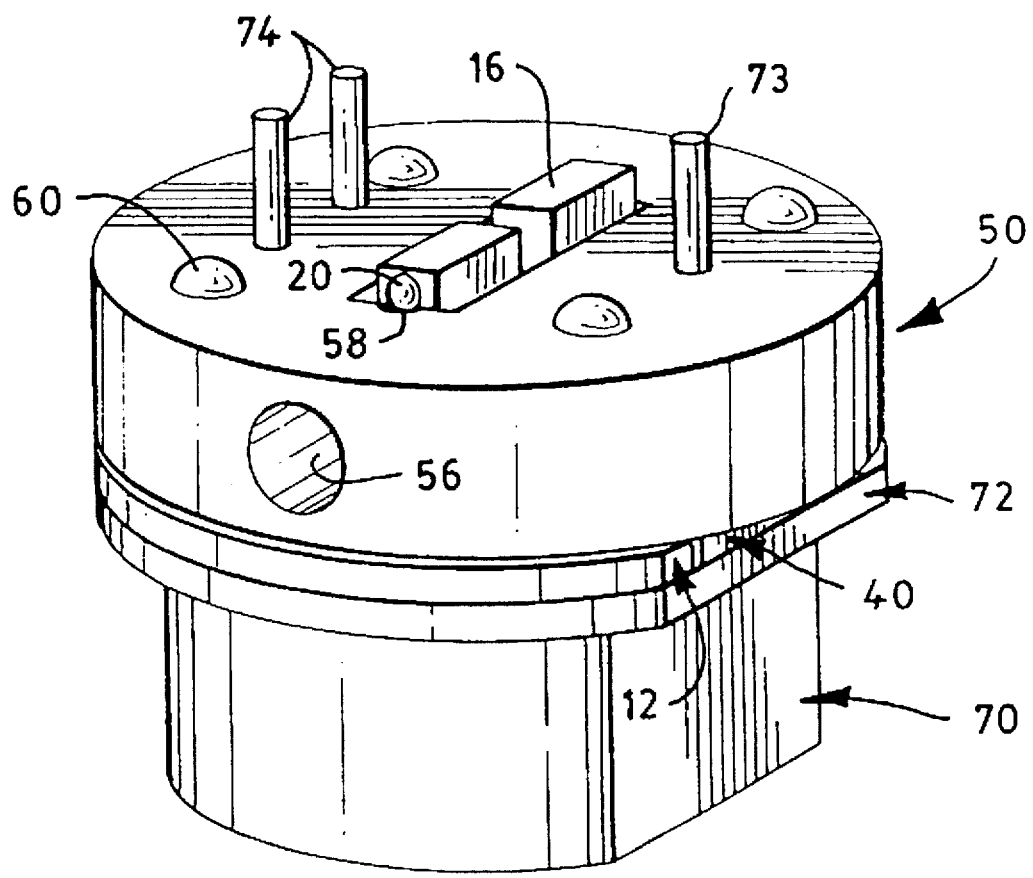
FIG. 3 shows a perspective view of an electrostatic discharge protection device as shown in FIG. 2 locked into the inoperative position.

FIG. 1B shows the ground plate 24 mated to the base disk 12 such that the vertical extensions 16 pass through the ground plate and interlock with the securing extensions 38. This figure further illustrates how the ground loop 40 is biased upwards towards an inner position where the connector pins 74 will pass through the pin holes 14 in the base disk 12.

The vertical extension 16 extends outward from the base disk 12 by a distance D. The vertical extensions pass into the aperture before in the actuation disk 50 such that the nubs 20 extend outward into the opposed tool holes 56 which pass through the actuation disk. The height D of the vertical extensions 16 therefore dictate an amount of vertical distance that the actuation plate disk 50 can move.

The vertical extensions have sidewalls that substantially fill the aperture 54, thereby allowing the vertical extensions 16 to guide the actuation disk on top of the semiconductor chip package. Nubs 20 restrict movement of the actuation disk in a vertical direction between a top and a bottom portion of the tool hole 56, and as the actuation disk 50 moves downward, riding along the lateral surfaces of the vertical extension 16. The ground loop 40 is pushed downward away from the conductor pins 74.

This motion allowing the ground loop 40 to be moved in and out of electrical contact with the conductor pins is useful for preassembly when testing the semiconductor chip package is required. In this way, a test technician can take the semiconductor chip package with the electrostatic discharge protection device attached and place it in a test circuit and gently put it into the test circuit, making the electrostatic discharge protection device move into an inoperative position by forcing the actuation disk 50 down against the ground plate 24 which withdraws the electrical connection of the ground loop 40 from the conductor pins 74. Upon successfully testing the semiconductor chip package 70, the technician can remove the electrostatic discharge protection device from the test circuit, and the electrostatic discharge protection device, using its resilient bias of the ground plate will force the actuation disk 50 upward, allowing the ground loop 40 to reestablish electrical shunt between the ground pin 73 and the connector pins 74. Thus, it is readily apparent from the figures that when the semiconductor chip package is not secured to a printed circuit board, the ground loop 40 urges its edge against and into electrical connection with the plurality of connector pins 74. In this manner the shorting of some or all of the plurality of connector pins 14 is accomplished so as to effectively protect the semiconductor chip package from electrostatic discharge which could operate to damage the electrical circuitry within the semiconductor chip package 70.

Figure 4:
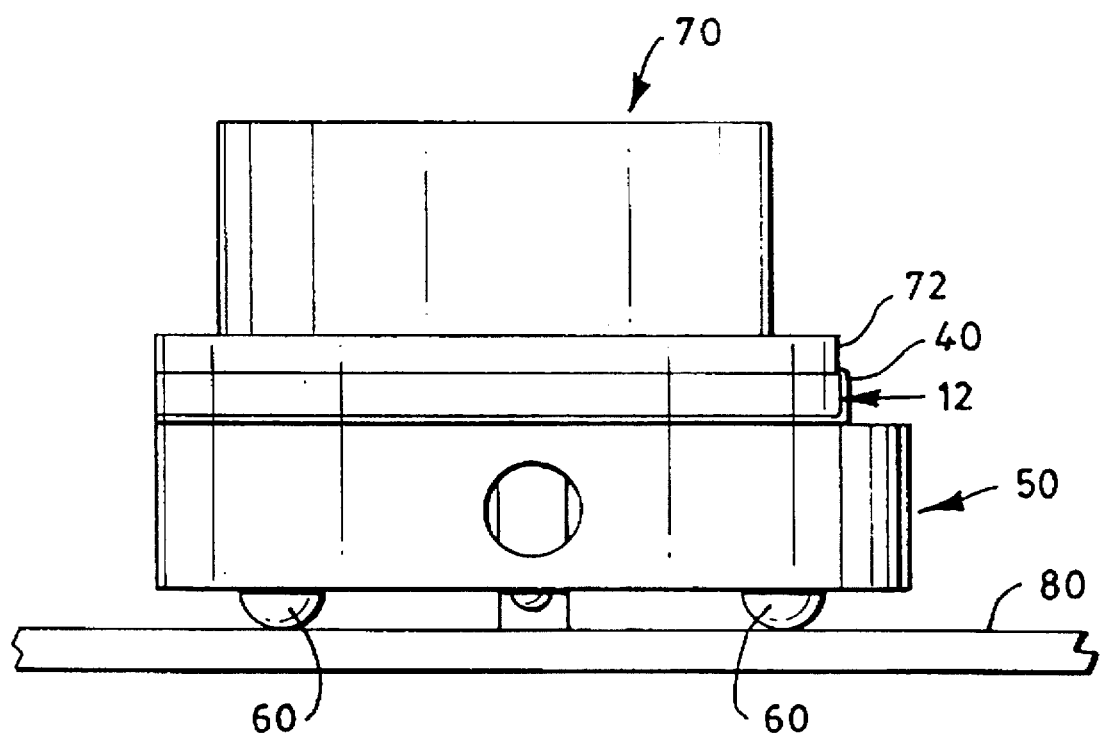
FIG. 4 is a perspective view of the electrostatic discharge protection device as shown in FIG. 2 mated to a printed circuit board.

When the semiconductor chip package 70 is ready for insertion into a circuit board or a mating receptacle, the actuation plate is pushed down into a locked position, making the electrostatic discharge protection device inoperative. This locked position can be achieved manually by pushing the actuation plate against the grounding means until the nubs 20 are forced against the upper wall of the aperture 56. Applying further force to the actuation plate disk forces the nubs to ride out of the aperture 56, which pushes the vertical extensions 16 inward toward each other. Further pushing the actuation disk 50 downward allows the nubs 20 to move into locking receptacles 58, which are indentations in the actuation disk 50. Vertical extensions 16 resume their normal vertical position, thereby forcing the nubs 20 into the locking receptacles 58, thus securing the actuation disk down and sandwiching the ground plate 24 such that the ground loop 40 is inoperative. Alternatively, the actuation disk can automatically withdraw the shunt between the connector pins 74 and the ground pin 73 by simply pushing the semiconductor chip package 70 into the printed circuit board as is shown in FIG. 4. The action allows the protrusions, which are hemispherical extensions from the actuation means to contact the printed circuit board, thus pushing the actuation disk 50 upwards against the semiconductor chip package 70, thus accomplishing the same basic functions as the manual steps previously described. Protrusions 60 can vary in height depending upon what type of assembly is being used. A receptor, for example, may be small such that there is no contact made with the actuation disk. Thus the protrusions must be large enough to reach past the receptacle to contact the printed circuit board 80, causing actuation.

Protrusions 60 are further effective in ensuring the space between device and circuit board required for washing out deleterious materials, e.g. smoldering residues.

The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. An electrostatic discharge protection device for use with a semiconductor chip package of a type having a top surface and an opposite bottom surface and a plurality of lateral surfaces integral with said top and bottom surfaces where a plurality of connector pins disposed in a spaced apart relationship with respect to each other extend from the bottom surface and at least one of the plurality of connector pins is a ground pin for electrically grounding the semiconductor chip package, said electrostatic discharge protection device comprising a base section which is substantially planar and is disposed on the bottom surface of the semiconductor chip package, the base section having a plurality of holes adapted to receive the plurality of connector pins;

grounding means extending from said base section and in electrical communication with the ground pin, the grounding means having an operative position for connecting a shunt between the ground pin and the plurality of connector pins, and having an inoperative position for disconnecting the shunt allowing electrical isolation between the plurality of connector pins and the ground pin; and actuation means moving parallel to the bottom lateral surface for moving said grounding means between the operative and inoperative positions.

2. The electrostatic discharge protection device according to claim 1 wherein the base section has one or more vertical extensions protruding vertically away from the bottom surface of the semiconductor chip package.

3. The electrostatic discharge protection device according to claim 2 wherein the actuation means is movable on the one or more vertical extensions to move the grounding means between the operative and inoperative positions.

4. The electrostatic discharge protection device according to claim 2 wherein the one or more vertical extensions lock actuation means such that the grounding means is secured in the inoperative position.

5. The electrostatic discharge protection device according to claim 4 wherein height of the one or more vertical extensions defines an amount of travel of the actuation means before locking the grounding means in the inoperative position.

6. The electrostatic discharge protection device according to claim 4 further comprising nubs on one or more vertical extensions which reversibly mate with receptacles in the actuation means to lock the actuation means.

7. The electrostatic discharge protection device according to claim 6 wherein the nubs are freely movable within the actuation means when outside of the receptacles providing free vertical motion of the actuation means.

8. The electrostatic discharge protection device according to claim 4 further comprising release means for allowing access to the one or more vertical extensions such that the one or more vertical extensions can be moved to an unlocked position thus allowing the actuation means to be movable into the operative position.

9. The electrostatic discharge protection device according to claim 2 wherein the one or more vertical extensions are outwardly biased.

10. The electrostatic discharge protection device according to claim 2 wherein the grounding means is secured to the base section by interconnecting with fastening cuts in the one or more vertical extensions.

11. The electrostatic discharge protection device according to claim 1 wherein ground means is secured to the grounding pin with an interference fit.

12. The electrostatic discharge protection device according to claim 1 wherein the ground means further comprises a tab which wraps around the base section into mechanical contact with the grounding pin so as to secure the ground means to the grounding pin.

13. The electrostatic discharge protection device according to claim 1 wherein the actuation means further comprises protrusions extending vertically from a bottom surface of the actuation means such that the provisions mechanically contact a circuit board to cause the actuation means to move the ground means into the inoperative position upon placement of the semiconductor chip package on the circuit board.

14. The electrostatic discharge protection device according to claim 13 wherein the protrusions have a height sufficient to provide clearance under the semiconductor chip package for washing the circuit board.

15. The electrostatic discharge protection device according to claim 13 wherein the protrusions have a height sufficient to actuate into the grounding means into a locked position.

16. In a electrostatic discharge protection system for discharging electrostatic charge from a semiconductor chip package having a ground pin and one or more conductor pins on an semiconductor chip package, where the electrostatic discharge protection system comprises a conductive grounding element having an operative position for placing a short circuit between the ground pin and the one or more conductor pins and having an inoperative position for disrupting the short circuit between the ground pin and the one or more conductor pins, the improvement comprising a nonconductive actuation structure substantially enclosing the conductive grounding element to move the grounding element between the operative position and inoperative position.

17. The electrostatic discharge protection device according to claim 16 wherein the nonconductive actuation structure further comprises a base section which is substantially planar and is disposed in mechanical contact with the semiconductor chip package, the base section having a plurality of holes adapted to receive the plurality of connector pins;

top member disposed in a plane substantially parallel to the plane of the base section and being movable on the plurality of connector pins so as to move the conductive grounding element between the operative and inoperative positions.

18. The electrostatic discharge protection device according to claim 17 wherein the base section has one or more vertical extensions protruding vertically away from the semiconductor chip package to guide movement of the top member.

19. The electrostatic discharge protection device according to claim 17 wherein the top member is reversibly lockable to maintain the conductive grounding element in the inoperative position.

20. The electrostatic discharge protection device according to claim 17 wherein base section is secured to the grounding pin with an interference fit.

21. The electrostatic discharge protection device according to claim 16 wherein the top member further comprises protrusions extending vertically from a bottom surface of the top member such that the protrusions mechanically contact a circuit board to cause the top member to move the conductive grounding element into the inoperative position upon placement of the semiconductor chip package on the circuit board.

\* \* \* \* \*